United States Patent [19]

Smith

[11] Patent Number: 4,625,175

[45] Date of Patent: Nov. 25, 1986

[54] DEVICE INDICATING THE TIME REMAINING OF THE USEFUL LIFE OF A BATTERY

[75] Inventor: Leonard S. Smith, Richfield, Minn.

[73] Assignee: Recreational Technologies Inc., Bloomington, Minn.

[21] Appl. No.: 513,604

[22] Filed: Jul. 14, 1983

[51] Int. Cl.$^4$ ............................................. G01N 27/46
[52] U.S. Cl. ..................................... 324/430; 320/48; 368/114; 324/431; 324/62
[58] Field of Search ............... 324/425, 426, 427, 429, 324/431, 435, 441, 62, 63, 64, 430, 74, 130, 131; 307/310; 368/113, 114; 320/48

[56] References Cited

U.S. PATENT DOCUMENTS

| | | |
|---|---|---|
| 406,975 | 7/1889 | Van Gestel . |
| 2,360,523 | 10/1944 | Simmons ............................ 324/62 R |
| 2,654,865 | 10/1953 | Klug ..................................... 324/106 |
| 2,991,413 | 7/1961 | Taylor ................................. 324/29.5 |
| 3,118,137 | 1/1964 | Vincent ............................... 340/249 |
| 3,125,718 | 3/1964 | Race .................................... 324/429 |
| 3,383,580 | 5/1968 | Wallace, Jr. ......................... 320/48 |
| 3,392,328 | 7/1968 | Figg ..................................... 320/48 |
| 3,401,337 | 9/1968 | Beusman ............................. 368/114 |
| 3,750,016 | 7/1973 | Low et al. ......................... 324/62 R |
| 3,780,322 | 12/1973 | Walters ............................... 307/318 |
| 4,075,560 | 2/1978 | Stifter ................................. 324/131 |
| 4,104,580 | 8/1978 | Juhasz ................................ 324/29.5 |

Primary Examiner—Michael J. Tokar
Attorney, Agent, or Firm—Leo Gregory

[57] ABSTRACT

This invention relates to a device which when connected to a storage battery of a type which is a prime power source, such as a lead acid storage battery, measures the open circuit voltage condition of the battery to give a reading in increments of time of the remaining useful life of the battery for a given use up to the point of full discharge of the battery.

6 Claims, 2 Drawing Figures

DEVICE INDICATING THE TIME REMAINING OF THE USEFUL LIFE OF A BATTERY

BACKGROUND OF THE INVENTION

1. Field of Invention

This invention relates to a device giving a reading in increments of time for a given use of the remaining useful life of a storage battery used as a prime power source.

2. Description of the Prior Art

To determine the amount of the remaining charge for use in a storage battery such as a lead acid storage battery, requires a complex procedure.

One method is to use a hydrometer which draws electrolyte from each of the cells of the battery and makes a comparison with a specific gravity reading to determine the percentage of charge in the battery.

Another method in use is a highly accurate laboratory volt meter to measure open circuit voltage of each cell and compare the readings to a calibration chart.

Extreme skill is required in using a meter. For example, in a typical 12 volt battery, the full charge is approximately 12.7 volts and the completely discharged battery has a voltage of approximately 11.7 volts. The entire use range of the battery's voltage excursion is only one volt in 12.7 or on the order of only 8%. A standard metering instrument would be unable to measure such a narrow voltage excursion and provide meaningful results. The results would have to be matched against a calibration curve for the particular type of battery being used before the result could be meaningful to an unskilled operator.

It is desirable to have a device to give an accurate output reading stating the remaining useful life of a battery in increments of time for any given use to which the battery is put as a prime power source, or that is to say, as a sole power source.

In making reference to prior art devices, Wallace in U.S. Pat. No. 3,383,580, discloses a device for use only with a dry cell battery to indicate a remaining time period of use. However, the device is required to be used with a series voltage regulator and with a controlled output and must be tested in a closed circuit, that is while the battery is in use, and requires that both the load and the ambient temperature be known and constant. Such a device does not permit use with anything directly powered by the battery without the inclusion of a series voltage regulator. In connection with this, the voltage regulator for its own operation may drain off as much as 25% to 40% of the battery energy. Thus device is not applicable to wet cell or rechargeable batteries. There are severe limitations to the use of the Wallace device.

Juhasz in U.S. Pat. No. 4,104,580 discloses a battery testing apparatus to provide a reading of output voltage on a scale having a plurality of subdivisions for variations in temperature. Ambient temperature significantly affects a reading. Juhasz does not have a single specific reading irrespective of ambient temperature. Juhasz talks about measuring battery voltage such as when a starter is operated. The reading given relates only to the then existing voltage. Thus gives no knowledge as to the remaining charge in the battery. Further Juhasz refers to the remaining storage capacity of this battery or its ability to store a charge as being measured. This relates merely to the size of the container and not as to what is in it. Juhasz does not read clear conclusions. He appears to refer mainly to measurement of voltage and capacity and does not provide an understanding of the extent of the useful life remaining in a storage battery at any given time for a given use. Juhasz would appear to provide a voltage reading as an indication of the remaining charge in a battery. Such a reading does not indicate the charge remaining in a battery. It would appear that the best that Juhasz tells you is whether the battery is operational or should be replaced. The whole thrust of the invention herein is to indicate how much useful charge is in the battery. It is noted here that a battery as a power source to start up a gasoline engine, for example, merely has a starting application and a full charge is subsequently restored as with an alternator. Such a battery has a different design or construction than a storage battery used or a prime power source and such batteries have different operational requirements. Such batteries are excluded from consideration herein.

SUMMARY OF THE INVENTION

This invention relates to a device connected across a storage battery in use as a prime power source which provides a reading of the remaining useful life of the battery in increments of time for any given use. For purpose of illustration reference is had to a lead acid storage battery.

More specifically the device comprising the invention herein includes a scale plate which reads out directly in units of time the remaining useful charge condition of a battery.

It is further an object of the invention herein to provide a device which has been particularly adapted to give accurate open circuit voltage readings for the voltage range of a battery of a particular voltage wherein for any given use said voltage reading provides in increments of time the operating time remaining in a battery up to its condition of full discharge.

More particularly it is an object of this invention to provide a device in connection with a storage battery which gives an open circuit reading of the useful life remaining in the battery up to its point of full discharge for any given use irrespective of ambient temperature or battery condition.

In connection with the preceding object, the device herein provides an expanded scale reading whereby meaningful readings are obtained of the useful range of a battery voltage which as indicated previously herein, may be only one volt in a 12.7 volt battery or on order of only 8% of the full voltage of a battery.

These and other objects and advantages of the invention will be set forth in the following description made in connection with the accompanying drawings in which like reference characters refer to similar parts throughout the several views.

DESCRIPTION OF A PREFERRED EMBODIMENT

Figure 1:
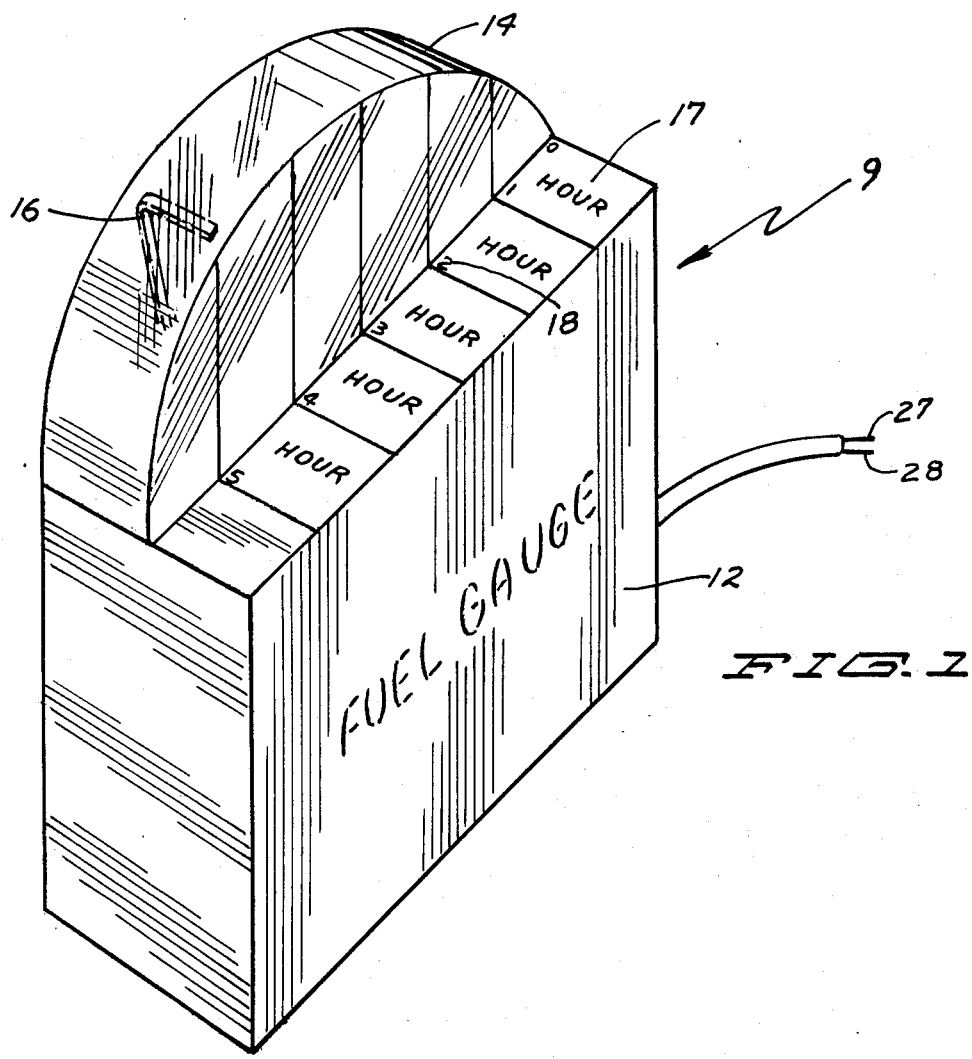
FIG. 1 is a view in perspective.
Figure 2:
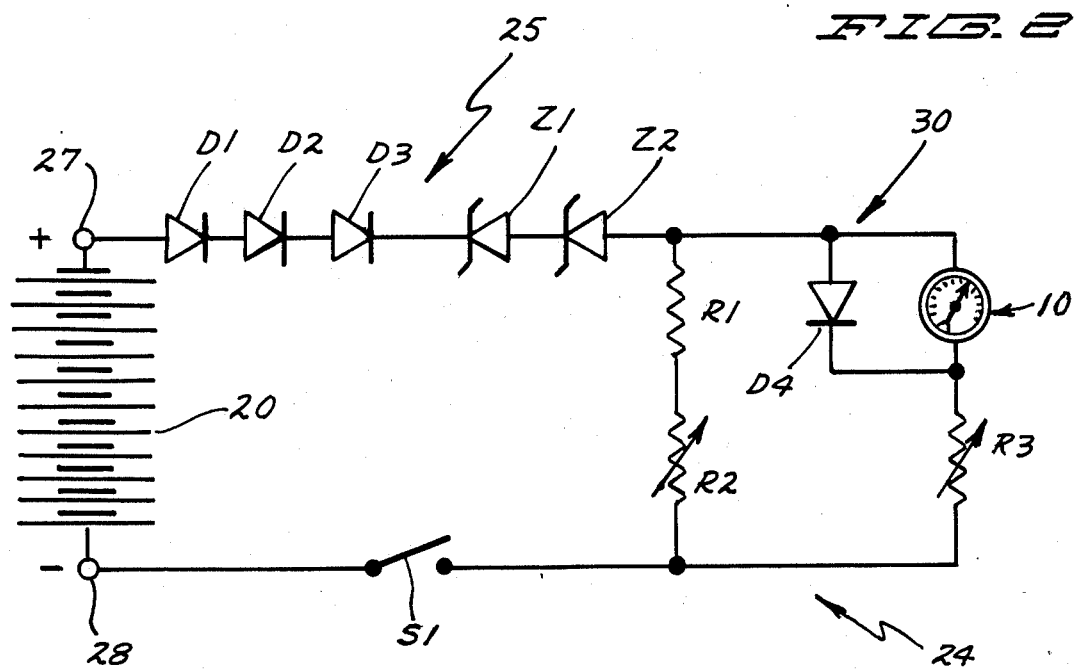
FIG. 2 is a schematic wiring diagram.

Referring to the drawings, the reference numeral 9 indicates the device herein which is a representation of one embodiment of the invention which is here shown in the form of housing 12 which is substantially parallelepiped and which embodies a conventional meter 10, see FIG. 2. However what is essentially embodied is the conventional circuitry of a meter which is referred to herein as meter 10. Said meter is influenced by the circuitry of the invention herein to be described.

Said housing is shown having a projecting curved dial 14 having therewith a dial indicator 16 and on a planar surface 17 forwardly thereof forming a linear scale or scale plate are indicia 18 which represent increments or points of time as from one through five hours, as here shown.

The connection of the circuitry of said device may be a conventional hook-up to the terminals of a storage battery 20 as indicated. Said device may be formed in a conventional manner to be integral with the housing of a battery or the battery housing may embody the circuitry of the device and have an exposed scale plate and an operating switch.

In FIG. 2 is shown a schematic wiring diagram illustrating a circuit 24 which represents the circuitry of this invention to influence the meter 10 to carry out the inventive concept herein and the same will be conventionally disposed in said housing and connected to the circuitry of said meter in a known manner of which no further description is given.

Said circuit 24 in the embodiment here illustrated comprises two parallel paths which are respectively indicated generally by the reference numerals 25 and 30. Each of said paths will be described separately.

Said path 25 will have its positive and negative terminals 27 and 28 appropriately connected to said battery 20 to be tested as indicated in FIG. 2.

Commencing with the positive terminal 27 of said path 25, included in said path are silicon diodes D1, D2 and D3 which are placed in series with the zener diodes Z1 and Z2 which are placed in a series with a resistor R1 and a variable resistor R2 through a switch S1 and thence to the negative terminal 28. This circuit as will be described is a calibration circuit.

Across said path 25 is said parallel path 30, comprising a diode D4 in parallel with said meter 10, said meter being in series with a variable resistor R3. These elements comprising said parallel path 30 make up a circuit which is characterized as a measurement circuit and which provides a reading of the time remaining of the useful life of a battery. The meter 10, as has been indicated and as shown in FIG. 2, is symbolic of the structure of the conventional meter embodied in the device 9.

Said parallel paths are further described as follows.

In the path 25 are the series diodes D1, D2 and D3 and the same are temperature compensating and provide a forward drop of approximately 0.65 volts each, as designed herein. That voltage drop is added to the voltage drops of the zener diodes Z1 and Z2 which are rated at 5.1 volts, whereby the total voltage drop in the series string of all of said diodes would equal approximately 12 volts.

Said diodes have very sharp conduction curves and provide a constant voltage drop across them which varies only minutely as the current through them changes.

The zener diodes, as is known, have a temperature coefficient which is the opposite that of the conventional diodes D1, D2 and D3. Hence, said circuit 25 is a zero temperature coefficient circuit, thereby providing a constant voltage drop regardless of ambient temperature. Thus, ambient temperature is not a factor herein.

The resistors R1 and R2 are load resistors for the series diode and zener diode string. The resistor R2 is also used as a calibration point for the meter 10.

Meter 10 and its series calibration resistor R3 are placed across resistors R1 and R2 and measure the voltage drop across those resistors. Since there are tolerances involved in all zener and conventional diodes, variable resistor R2 is provided to change the amount of current flowing through the diodes back to the negative terminal when the switch S1 is depressed.

The resistor R2 is adjusted to a particular voltage drop to calibrate the zero point or increment of time to be indicated on said scale plate 17. This zero point is not the mechanical zero point of the meter but is an electrical zero point indicating a zero percent of charge or zero time left for use of the battery to operate the apparatus powered by it. The indicia on the scale plate 17 indicate electrical points or increments of time.

The mechanical zero point of the meter is somewhat below the electrical zero point of the scale plate, therefore, the pointer or dial indicator 16 position when not energized will be somewhat below the electrical zero point.

The calibration on a 12 volt lead acid battery would be made when a voltage of 11.7 volts is applied between the terminals 27 and 28 with the switch S1 depressed. The calibration is done by adjusting the resistor R2 to make the dial indicator read a zero point on the scale plate 17 with a constant voltage of 11.7 impressed on the circuit.

Resistor R3 adjusts the upper limit of the measurement on the scale plate which on the scale plate shown would be the five hour point position or the 100% point position on the scale 17 to indicate a fully charged battery.

The calibration of resistor R3 is done after the zero point has been calibrated using resistor R2. To do this you then apply 12.7 volts between the terminals 27 and 28 and holding the switch S1 closed, the resistor R3 is adjusted until the dial indicator 16 reads on the five hour line of the scale plate 17.

The five hour scale limit line is not the upper mechanical limit but only an electrical upper limit specified in the present circuit design. The dial indicator would show a higher reading if the voltage impressed upon the circuit was something in excess of 12.7 volts.

The scale plate 17 as shown, provides a linear reading. The dial indicator 16 gives a reading from the edge of its functional direction. The particular embodiment of the device shown is useable to meet small space requirements and provide a very readable scale.

It is noted that by means of the above described circuitry of the invention herein that there has been impressed across the meter 10 the entire meaningful range of the battery's voltage excursion which is only one volt, as above described, and the reading thereof has been expanded to such an extent that minute changes in voltage are very easy for an unskilled operator to read on the scale plate 17 to ascertain how long any given use of the battery as a prime source of power can continue in specific increments of time on the amount of charge left in the battery. A state of the art meter not modified as herein indicated would be unable to measure such a narrow voltage excursion and provide readable meaningful results.

Referring to FIG. 2, the path 30 as a measurement circuit for this meter 10 provides the extreme accuracy necessary for the scale plate readings by having both ends of the scale plate calibrated to specific voltages and by having a zero temperature coefficient arranged in the diodes. Ambient temperature does not affect the scale plate readings.

The device provides a meaningful reading only when the battery is at rest and not under load. The switch S1 is provided to ensure that the device is operable only when the switch is depressed.

It will be understood that the device herein is not limited to use with an edge reading scale plate, but is also useable with a conventional circular dial.

For measurement purposes herein, the energy requirement to operate the dial indicator is so insignificant that it may well be disregarded.

To obtain a reading, the equipment being powered is shut off or disconnected from battery to be measured or tested. A time period such as 60 seconds thereafter should be allowed to pass for the battery to normalize. The switch S1 is depressed and the scale plate 17 gives a reading of the useful life remaining in the battery in increments of time to the point of full discharge of the battery.

Conversely, if the battery has just been charged, the battery would cause an abnormally high reading on the scale plate. Hence, the battery should first be used for approximately ten minutes and then the battery be allowed to be at rest before taking a reading.

The scale plate 17 reading provided herein is a very useful improvement in the art. In the present state of the prior art, for the most part, battery powered functions are without means of measuring the operating time left of useful battery power.

With reference to the circuit 30, the diode D4 in parallel with meter 10 has the function of limiting the amount of voltage that can be impressed across said meter to approximately 0.65 volts due to its forward conduction characteristics. This is a safety feature in the circuit in the event that switch S1 is depressed while the battery is being charged and the voltage at the terminals 27 and 28 could be in excess of 15 volts. This would cause an overcurrent condition in said meter 10 and since the meter has been modified herein to have an expanded range, such an overcurrent condition could be severe enough to possibly cause damage to the meter.

The internal resistance of the meter 10 is selected to be such that the current through it at its extreme mechanical full scale range calculates to a voltage drop of that of diode D4.

Therefore, any over voltage above 0.65 which is applied across the diode D4 terminals will be transferred to resistor R3 and dissipated without going through the meter 10.

Thus the diode D4 is a protective shunt across the meter 10 which comes into use only to shunt harmful overcurrent from said meter.

Referring again to the scale plate 17 and the scale indicator 16, it should be recognized that the values of the increments of time on the scale are dependent on battery load requirements. For example, if the load apparatus on 100 ampere hour battery is 20 amps., then a five hour time relationship would be used. If the load requirement were only five amperes, then there would be used a scale having increments of time reading from zero to twenty hours for a 100 ampere battery. Thus there is given a reading of the number of operating hours left in the battery, until it requires a re-charge for the particular load to which the battery is applied.

The device herein is applicable in connection with any piece of apparatus wherein the battery is the prime or sole operating power source—such as with an electric outboard motor, an electrical operated wheelchair, golf carts, floor machines and the like.

The embodiment of the invention herein relates to a 12 volt battery. However, the invention herein may relate to devices designed for use with such as 6 volt, 24 volt or 36 volt batteries.

For batteries other than 12 volts, the values of all of the diodes and of the resistors would be required to be appropriately changed.

This invention relates to a device whereby even an unskilled operator of a piece of battery powered equipment may quickly test the battery's percent of charge in an open circuit condition and obtain a clearly understandable reading and eliminated from such a reading are the errors which could influence such a measurement due to temperature change and battery condition. Thus the device herein may be scaled for any battery size and load condition to give an accurate indication of the amount of battery operating time remaining at any given time for a given load.

It will of course be understood that various changes may be made in form, details, arrangement and proportions of the parts without departing from the scope of the invention herein which, generally stated, consists in an apparatus capable of carrying out the objects above set forth, in the parts and combinations of parts disclosed and devised in the appended claims.

What is claimed is:

1. A device for a battery in open circuit condition measuring in increments of time, the remaining useful life of a storage battery to the point of full discharge where the battery is used as a prime source of power, having in combination
    a series circuit connected in parallel to a storage battery in an open circuit condition,
    means included in said series circuit indicating the entire useful range of the open circuit voltage excursion of said battery on a full scale in increments of time, and
    said means including means indicating in increments of time the remaining useful life of said battery for any particular use.

2. A device for a battery in an open circuit condition measuring in increments of time, the useful life of a storage battery to the point of full discharge where the battery is used as a prime source of power, having in combination
    a series circuit connected in parallel to a storage battery in an open circuit condition,
    a scale having indicia thereon included in said series circuit indicating in increments of time, across the full extent thereof, the entire useful range of the voltage excursion of said battery,
    means indicating the reading on said scale of the time of use remaining of the useable charge of said battery for a particular use, and
    means in said circuit calibrated to influence said last mentioned means to indicate a reading on said scale with said battery in an open circuit condition.

3. A device for a battery in an open circuit condition measuring in increments of time, the remaining useful life of a storage battery to the point of full discharge of the battery, having in combination
    a series circuit connected in parallel to a storage battery in an open circuit condition comprising means included in said circuit calibrated to provide a zero voltage reading at the point of full discharge of the useable charge of said battery, means included in said circuit calibrated to provide a reading of the total useable charge of said battery, a scale in connection with said circuit, said scale bearing indicia giving said first and second mentioned readings and like readings therebetween in increments of time, means in said circuit in parallel with said scale shunting voltage which is in excess of the safe limit of voltage impressed across said scale, and a switch in said circuit.

4. A device for a battery in an open circuit condition measuring in increments of time, to the point of full discharge, the useful life of a storage battery used as a prime source of power, having in combination a series circuit connected to a storage battery in an open circuit condition, a scale in connection with said circuit bearing indicia giving a full scale reading in increments of time of the useable range of voltage excursion of said battery, means included in said circuit calibrated to provide a reading on said scale of the remaining useable charge of said battery for a particular use, and a shunt included in said circuit limiting the amount of voltage impressed across said scale to be read thereon to be not more than that of the maximum allowable current rating of said scale.

5. A device for a storage battery in an open circuit condition indicating to the point of full discharge, the useful life of a storage battery used as a prime source of power, having in combination a series circuit connected in parallel to a storage battery in an open circuit condition, a scale in connection with said circuit bearing indicia which provide readings in increments of time, means included in said circuit calibrated to provide scale readings from a reading on said scale indicating a full charge in said battery to a reading indicating a full discharge of the remaining useful charge of said battery, means included in said circuit in parallel with said scale limiting the voltage that can be impressed across said scale, and means opening said circuit to obtain a reading on said scale.

6. A device with a battery in open circuit condition indicating in increments of time, the remaining useable charge of a storage battery for a particular use where the battery is the prime source of power, having in combination a series circuit connected in parallel to a battery in open circuit condition, a scale included in said circuit bearing indicia which give a voltage reading of the useable charge in said battery in increments of time, means indicating a reading on said scale, a resistor calibrated to cause said means to indicate a zero voltage reading at the point of the discharge of the useable charge in said battery at one end of said scale, a second resistor calibrated to cause said means to indicate a voltage reading at the point indicating a full useable charge in said battery at the other end of said scale, whereby said first and second mentioned resistors define the extent of said scale across which the range of said battery's voltage excursion extends.

* * * * *